(12) United States Patent
Liu et al.

(10) Patent No.: US 10,741,698 B2
(45) Date of Patent: Aug. 11, 2020

(54) SEMI-FLOATING GATE FET

(71) Applicant: STMICROELECTRONICS, INC., Coppell, TX (US)

(72) Inventors: Qing Liu, Irvine, CA (US); John H. Zhang, Altamont, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 16/355,398

(22) Filed: Mar. 15, 2019

(65) Prior Publication Data

US 2019/0252551 A1    Aug. 15, 2019

Related U.S. Application Data

(60) Continuation of application No. 15/723,149, filed on Oct. 2, 2017, now Pat. No. 10,256,351, which is a
(Continued)

(51) Int. Cl.
*H01L 29/66* (2006.01)
*H01L 29/788* (2006.01)
*H01L 27/088* (2006.01)

(52) U.S. Cl.
CPC ........ *H01L 29/7883* (2013.01); *H01L 27/088* (2013.01); *H01L 29/66666* (2013.01); *H01L 29/7889* (2013.01); *H01L 29/66825* (2013.01)

(58) Field of Classification Search
CPC ............. H01L 29/7883; H01L 29/7889; H01L 29/66666; H01L 29/66825; H01L 27/088;
(Continued)

(56) References Cited

U.S. PATENT DOCUMENTS 6,376,312 B1 * 4/2002 Yu .......................... H01L 21/84
                                                          257/220
6,433,382 B1    8/2002 Orlowski et al.
(Continued)

FOREIGN PATENT DOCUMENTS

CN       103887313 A     6/2014
WO    2014/177045 A1    11/2014
(Continued)

OTHER PUBLICATIONS

Wang et al., "A Semi-Floating Gate Transistor for Low-Voltage Ultrafast Memory and Sensing Operation," *Science* v. 341, pp. 640-643 (2013) (4 pgs.).

*Primary Examiner* — Natalia A Gondarenko
(74) *Attorney, Agent, or Firm* — Seed IP Law Group LLP

(57) ABSTRACT

A semi-floating gate transistor is implemented as a vertical FET built on a silicon substrate, wherein the source, drain, and channel are vertically aligned, on top of one another. Current flow between the source and the drain is influenced by a control gate and a semi-floating gate. Front side contacts can be made to each one of the source, drain, and control gate terminals of the vertical semi-floating gate transistor. The vertical semi-floating gate FET further includes a vertical tunneling FET and a vertical diode. Fabrication of the vertical semi-floating gate FET is compatible with conventional CMOS manufacturing processes, including a replacement metal gate process. Low-power operation allows the vertical semi-floating gate FET to provide a high current density compared with conventional planar devices.

17 Claims, 17 Drawing Sheets

Related U.S. Application Data division of application No. 14/739,634, filed on Jun. 15, 2015, now Pat. No. 9,799,776.

(58) Field of Classification Search
CPC ............... H01L 27/0924; H01L 27/092; H01L 27/0886; H01L 27/12; H01L 29/0878; H01L 29/66; H01L 29/66636; H01L 29/6659; H01L 29/66795; H01L 29/66477; H01L 29/78618; H01L 29/78; H01L 29/785; H01L 21/02532; H01L 21/2652; H01L 21/823412; H01L 21/22; H01L 21/225; H01L 21/2256; H01L 21/2253; H01L 21/28176; H01L 21/2818; H01L 21/823807; H01L 21/8234; H01L 21/8238; H01L 21/823821; H01L 21/823814; H01L 21/84
USPC .................................................. 257/315, 316
See application file for complete search history.

(56) References Cited

U.S. PATENT DOCUMENTS

| | | | |
|---|---|---|---|
| 7,425,491 B2* | 9/2008 | Forbes | ................... B82Y 10/00 257/E21.41 |
| 7,465,622 B2* | 12/2008 | Lin | ................... H01L 21/82348 257/328 |
| 8,759,874 B1 | 6/2014 | Loubet et al. | |
| 8,956,942 B2 | 2/2015 | Loubet et al. | |
| 9,293,560 B2* | 3/2016 | Doyle | ............... H01L 29/66431 |
| 9,385,195 B1 | 7/2016 | Zhang | |
| 9,502,518 B2 | 11/2016 | Liu et al. | |
| 2003/0015755 A1 | 1/2003 | Hagemeyer | |
| 2007/0215954 A1 | 9/2007 | Mouli | |
| 2009/0200540 A1 | 8/2009 | Bjoerk et al. | |
| 2010/0117138 A1 | 5/2010 | Huerta et al. | |
| 2011/0253981 A1 | 10/2011 | Rooyackers et al. | |
| 2013/0341596 A1 | 12/2013 | Chang et al. | |
| 2014/0117431 A1* | 5/2014 | Masuoka | .......... H01L 27/11521 257/316 |
| 2015/0123193 A1* | 5/2015 | Masuoka | ............ H01L 21/2251 257/329 |
| 2015/0325663 A1 | 11/2015 | Wang et al. | |
| 2016/0043225 A1 | 2/2016 | Ching et al. | |
| 2016/0104714 A1* | 4/2016 | Endoh | ................ G11C 16/0425 257/321 |
| 2016/0190312 A1 | 6/2016 | Zhang et al. | |
| 2016/0293756 A1 | 10/2016 | Liu et al. | |

FOREIGN PATENT DOCUMENTS

| | | |
|---|---|---|
| WO | 2015/067100 A1 | 5/2015 |
| WO | 2015/131527 A1 | 9/2015 |

* cited by examiner

SEMI-FLOATING GATE FET

BACKGROUND

Technical Field

The present disclosure generally relates to semi-floating gate devices for use in semiconductor memory applications.

Description of the Related Art

A FinFET is an electronic switching device in which a conventional planar semiconducting channel is replaced by a semiconducting fin that extends outward from a top surface of a silicon substrate. In such a device, the gate, which controls current flow in the fin, wraps around three sides of the fin so as to influence current flow from three surfaces instead of one. The improved control achieved with a FinFET design results in faster switching performance and reduced current leakage than is possible with a planar transistor. FinFETs are described in further detail in U.S. Pat. No. 8,759,874, and U.S. Patent Application Publication US2014/0175554, assigned to the same assignee as the present patent document.

A vertical GAA FET is a linear, or 1-D, device in the form of a nanowire, oriented transverse to planar front and back surfaces of the silicon substrate. The nanowire includes source, channel, and drain regions that are grown epitaxially. One or more annular gates surround the channel region, capacitively controlling current flow through the channel from all sides. GAA FETs are described in further detail in U.S. patent application Ser. Nos. 14/588,337 and 14/675,536, assigned to the same assignee as the present patent document.

Floating gate transistors are used in non-volatile semiconductor memory applications such as flash memory and electrically programmable read only memory (EPROM) devices. A conventional floating gate (FG) transistor memory cell is a variant of a metal-oxide-semiconductor field effect transistor (MOSFET) device. In a MOSFET, a voltage applied to a control gate electrode controls current flow in a channel between source and drain terminals. The control gate is separated from the channel by a gate dielectric. In a floating gate transistor, a second, floating, gate is inserted in the dielectric between the channel region and the control gate. The floating gate is thus electrically isolated, so that charge placed onto the floating gate is trapped. The control gate can then be used either to inject charge onto, or to extract charge from, the floating gate to change the bit state of the memory cell, via a tunneling effect. Depending on its polarity, charge trapped on the floating gate will then either permit or block current flow in the channel.

A semi-floating gate (SFG) transistor is shown schematically in FIG. 2a, and in cross-section in FIG. 2b, as described in "A Semi-Floating Gate Transistor for Low-Voltage Ultrafast Memory and Sensing Operation," P. F. Wang et al., Science v. 341, August 2013. The SFG transistor differs from a FG transistor in that the second gate is coupled to the drain, forming a p-n junction diode. Thus, the electric potential of the SFG transistor is not truly floating, but instead is semi-floating. In one implementation, the control gate is also extended to form an embedded tunneling FET (TFET) that biases the p-n diode accordingly, to charge or discharge the SFG transistor. Thus, the SFG transistor includes three devices in one: a MOS transistor, a p-n diode, and a TFET. A conventional SFG transistor is capable of operating at low voltages, less than 2.0 V, and high speeds, on the order of a nanosecond, to complete a write operation. Thus, SFG transistors appear to be promising in that they reduce power consumption while increasing the speed of volatile memory devices. However, a disadvantage of the SFG transistor shown in FIGS. 2a and 2b is that the extensions made to form the p-n diode and the TFET increase the footprint of the device, which limits the memory density of a SFG transistor array.

BRIEF SUMMARY

A semi-floating gate transistor is implemented as a vertical FET built on a silicon substrate. The source, drain, and channel are vertically aligned, on top of one another in either a fin configuration or a gate all-around vertical nanowire configuration. In the fin configuration, current flow between the source and the drain is influenced from two sides of the channel by a control gate and a semi-floating gate. In the vertical nanowire configuration, current flow is influenced radially by concentric wrap-around gates. In both configurations, the semi-floating gate is adjacent to the channel. Front side contacts can be made to each one of the source, drain, and control gate terminals of the vertical SFG FET device.

The vertical SFG FET further includes a vertical TFET, and a vertical p-n diode. A vertical TFET suitable for low-power, low-voltage applications is disclosed in U.S. patent application Ser. Nos. 14/675,298 and 14/675,536, assigned to the same assignee as the present patent document. Fabrication of the vertical SFG FET is compatible with conventional CMOS manufacturing processes, including replacement metal gate (RMG) and self-aligned contact (SAC) processes. Low-power operation allows the vertical SFG FET to provide a high current density, or "current per footprint" on a chip, compared with conventional planar devices. Hence, the vertical SFG FET provides improvements in memory density as well as improving speed and power consumption.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIG. 4 shows layers that will make up the vertical SFG FET, according to one embodiment described herein.

FIG. 5 shows the $N^{++}$ source region and the $N^-$ channel region of the vertical SFG FET, according to one embodiment described herein.

FIG. 6 shows the channel region with a gate dielectric and sidewall spacers, according to one embodiment described herein.

FIG. 7 shows the channel region of FIG. 6 after formation of a p-n diode, according to one embodiment described herein.

FIG. 8 shows a vertical SFG FET after formation of the semi-floating gate, according to one embodiment described herein.

FIGS. 9, 10 show the vertical SFG FET of FIG. 8 after formation of an extension of the channel region, according to one embodiment described herein.

FIG. 11 shows the vertical SFG FET of FIG. 10 after formation of the control gate, according to one embodiment described herein.

FIG. 12 shows the vertical SFG FET of FIG. 11 after formation of a cap over the control gate, according to one embodiment described herein.

FIG. 13 shows the vertical SFG FET of FIG. 12 after formation of the $N^{++}$ drain region, according to one embodiment described herein.

FIG. 15 shows the vertical SFG FET of FIG. 9 after formation of the $N^{++}$ drain region, according to one embodiment described herein.

FIG. 16 shows the vertical SFG FET of FIG. 15 after formation of sidewall spacers, according to one embodiment described herein.

FIG. 17 shows the vertical SFG FET of FIG. 16 after recessing the control gate, according to one embodiment described herein.

FIG. 18 shows the vertical SFG FET of FIG. 17 after formation of a contact hole accessing the $N^{++}$ drain region, according to one embodiment described herein.

DETAILED DESCRIPTION

Figure 1:
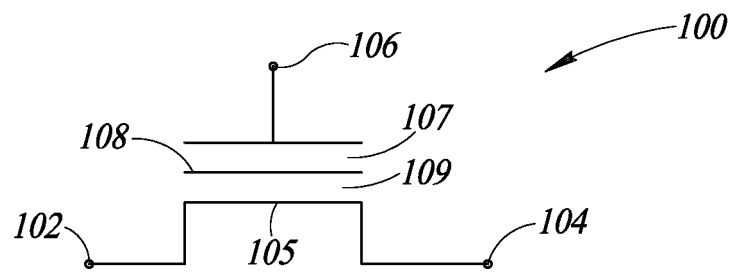
FIG. 1 is a circuit schematic diagram of a conventional floating gate transistor used in volatile memory products, according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like, and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to semi-floating gate devices that have been produced; however, the present disclosure and the reference to certain materials, dimensions, and the details and ordering of processing steps are exemplary and should not be limited to those shown.

Turning now to the figures, FIG. 1 shows a conventional circuit schematic representation of a floating gate transistor 100. The floating gate transistor 100 includes a source 102, a drain 104, a control gate 106, and a floating gate 108. In operation, current flows through a channel 105 between the source 102 and the drain 104 in response to a voltage applied to the control gate 106. A gate dielectric separating the control gate 106 from the channel 105 includes two layers—a first dielectric layer 107 separating the control gate 106 from the floating gate 108, and a second dielectric layer 109 separating the floating gate 108 from the channel 105. There are no direct electrical connections to the floating gate 108. The voltage on the floating gate 108 floats, according to the influence of nearby electric charge. However, charge on the floating gate 108 can be altered by applying a voltage to the control gate 106, causing electrons to tunnel from the control gate 106, through the first dielectric layer 107, to the floating gate 108. Such a tunneling process is known by those skilled in the art as Fowler-Nordheim tunneling.

Figure 2A:
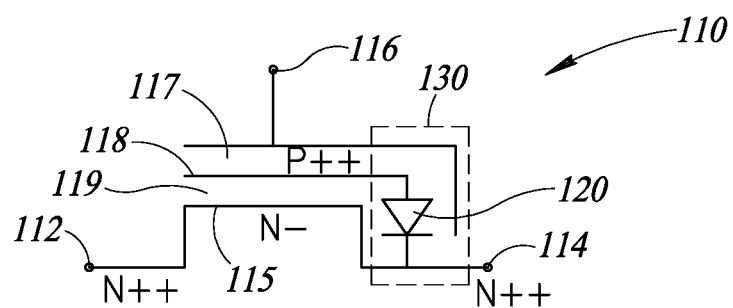
FIG. 2A is a circuit schematic diagram representing a semi-floating gate (SFG) transistor that includes an embedded TFET, such as the devices described herein.

FIG. 2A shows a circuit schematic representation of a semi-floating gate (SFG) transistor 110, such as the vertical SFG transistors described herein. The semi-floating gate transistor 110 includes an $N^{++}$ source 112, an $N^{++}$ drain 114, a control gate 116, and a semi-floating gate 118. In operation, current flows through an $N^-$ channel 115 between the $N^{++}$ source 112 and the $N^{++}$ drain 114. A second gate dielectric 117 separates the control gate 116 from the semi-floating gate 118. A first gate dielectric 119 separates the semi-floating gate 118 from the $N^-$ channel 115. One end of the semi-floating gate 118 is electrically coupled to the $N^{++}$ drain 114 via a p-n diode 120 and an embedded tunneling FET (TFET) 130, while the other end is floating. Thus, the semi-floating gate transistor 110 includes three devices in one: an MOS transistor, the TFET 130, and the p-n diode 120. When the voltage on the control gate 116 is negative, the TFET turns on and a tunneling current flows from the $N^{++}$ drain 114 to the semi-floating gate 118, thereby charging the semi-floating gate 118. When the voltage on the control gate 116 is positive, the p-n junction diode 120 is forward-biased and current flows from the semi-floating gate 118 to the $N^{++}$ drain 114, thereby discharging the semi-floating gate 118.

Figure 2B:
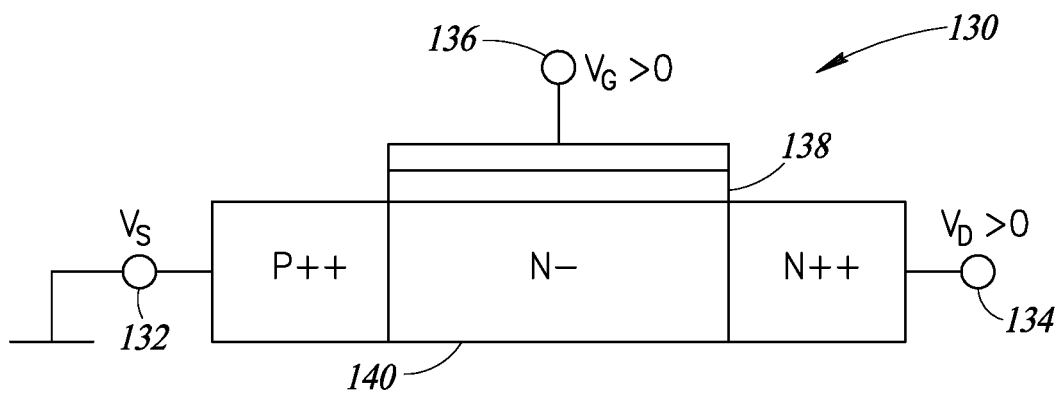
FIG. 2B is a schematic diagram showing the terminals and doped regions of a tunneling field effect transistor (TFET) such as those described herein.

FIG. 2B shows an integrated n-channel implementation of the TFET 130 shown schematically in FIG. 2A. The n-channel TFET 130 includes a TFET source terminal 132 that is heavily p-doped, a drain terminal 134 that is n-doped, a gate terminal 136, a gate dielectric 138, and a TFET channel 140 that is lightly n-doped. The n-channel TFET 130 operates in response to a positive voltage applied to the gate terminal 136. Instead of being an n-p-n transistor, the n-channel TFET 130 is a $p^{++}$-$n^-$-$n^{++}$ device. Such a doping profile causes energy bands characterizing the silicon at the $p^{++}$-$n^-$ junction to be arranged so as to allow charge carriers to tunnel through the junction. Tunneling efficiency is improved when silicon germanium (SiGe) is used as the $p^{++}$ material. The TFET 130 is integrated into the semi-floating gate transistor 110 by coupling the TFET source terminal 132 to the semi-floating gate 118, and the drain terminal 134 to the $N^{++}$ drain 114.

Figure 3:
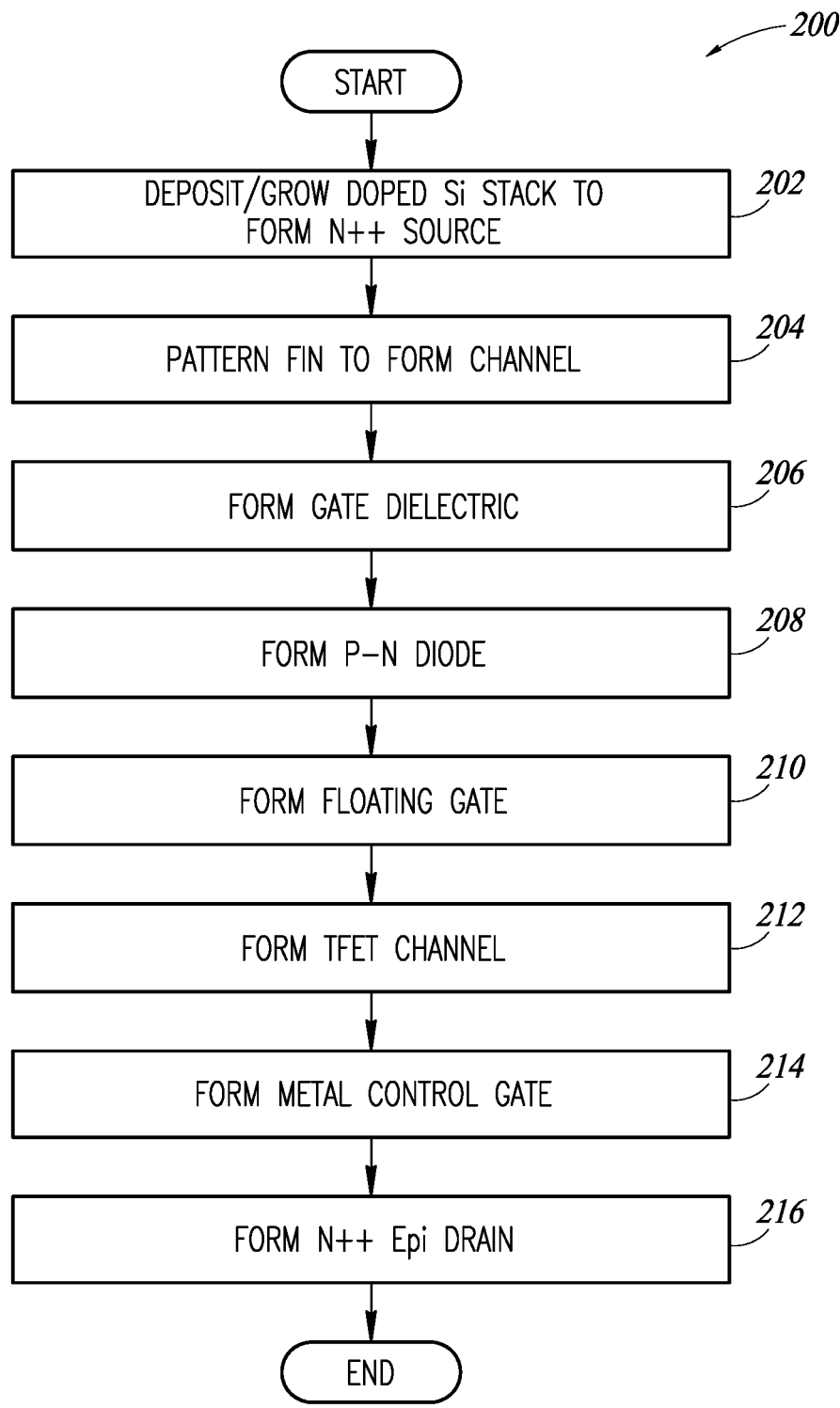
FIG. 3 is a flow diagram showing steps in a method of fabricating a vertical semi-floating gate FET as illustrated in FIGS. 4-13, according to one embodiment described herein.
Figure 18:
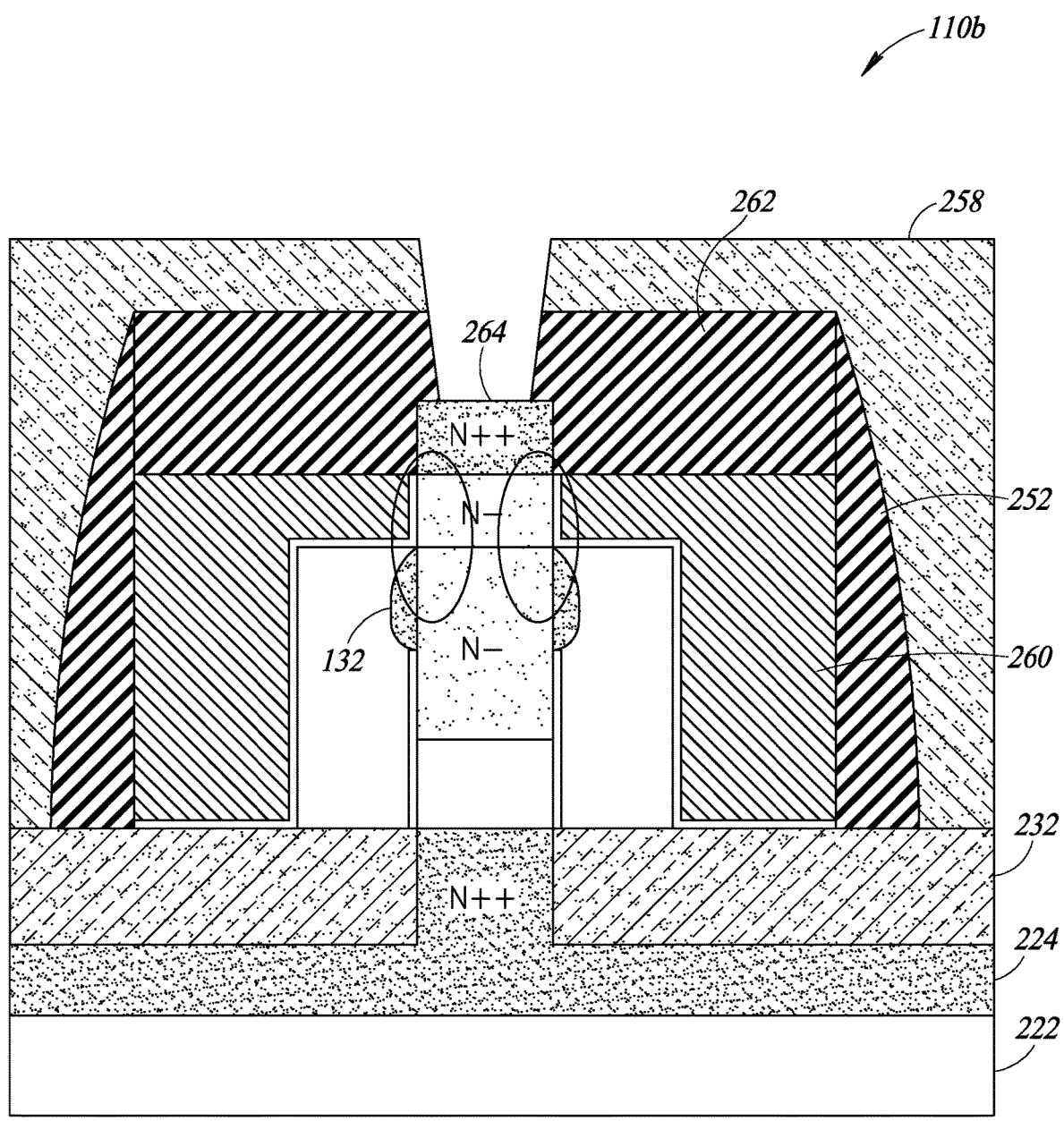

FIG. 3 shows steps in an inventive method 200 of fabricating a vertical SFG FET 270 that implements the vertical semi-floating gate transistor 110 as a nanoscale integrated circuit device, according to one embodiment. A p-n diode 120 and a TFET 130 are integrated into the structure of the vertical SFG FET. The completed vertical SFG FET 110a produced by the method 200 is shown in FIG. 13. An embodiment of the vertical SFG FET 110b that can be fabricated by a modified method 300 is shown in FIG. 18. Steps in the method 200 are further illustrated by FIGS. 4-13, and described below.

Figure 4:
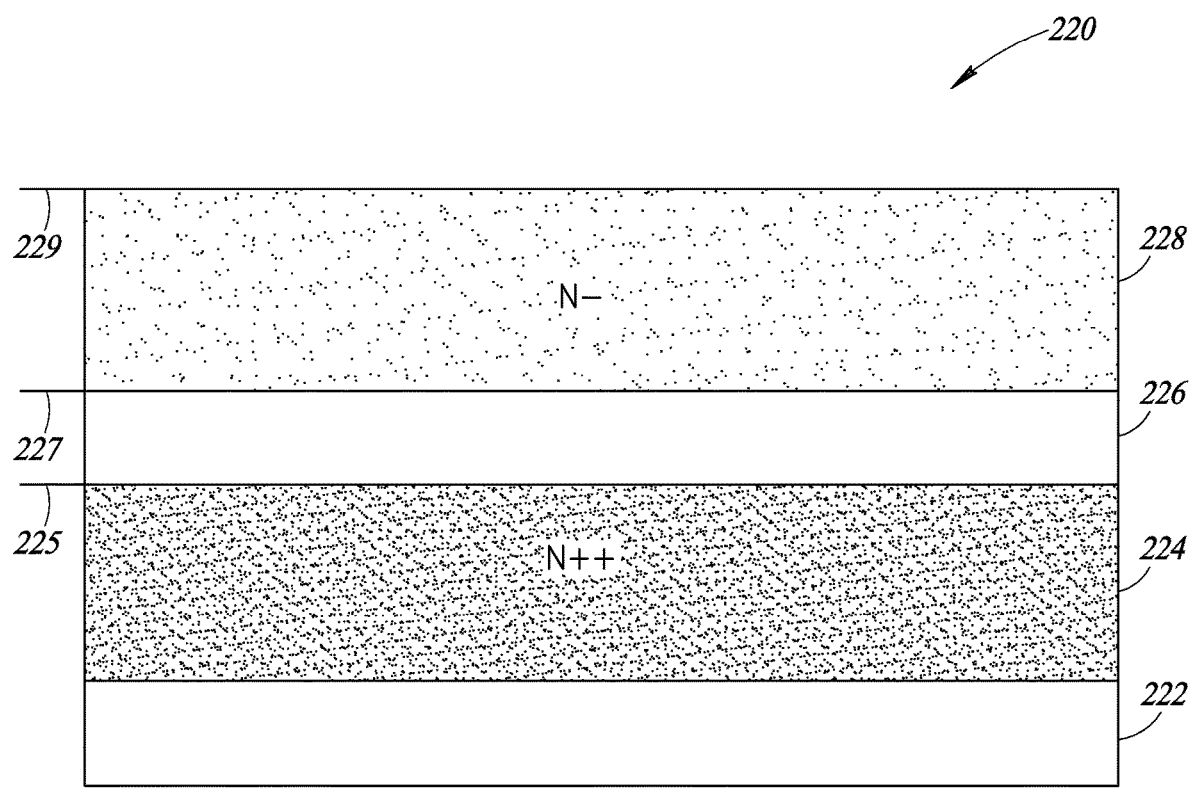
FIGS. 4-13 are cross-sectional views of a vertical semi-floating gate FET at successive steps during fabrication, using the method outlined in FIG. 3.

At 202, with reference to FIG. 4, a bulk silicon substrate 222 is doped to form a film stack 220 having multiple layers, according to one embodiment. The film stack 220 includes a heavily doped $N^{++}$ source region layer 224, an intrinsic silicon layer 226, and a lightly doped $N^-$ channel region layer 228. In one embodiment, dopants are incorporated into the $N^{++}$ source region layer 224 by ion implantation into a top surface 225 of the silicon substrate 222 and then annealed to drive in the $N^{++}$ source region dopants to a selected depth in the range of about 20-30 nm below the substrate surface 225. Alternatively, the $N^{++}$ source region layer 224 can be formed by epitaxial growth from the bulk silicon substrate 222, in which positive dopants such as boron ions can be introduced in-situ, during the epitaxy process. The source region dopant concentration is targeted at about $1.0\ E20\ cm^{-3}$. Once the source region dopants are incorporated, a 10-15 nm layer of intrinsic silicon layer 226 is epitaxially grown from the surface 225 of the $N^{++}$ source region layer 224. Then, the $N^-$ channel region layer 228 can be grown epitaxially from a top surface 227 of the layer of intrinsic silicon layer 226. The thickness of the channel region layer 228 is in the range of about 20-30 nm and the concentration of negative dopants is about $1.0\ E19\ cm^{-3}$. Alternatively, the intrinsic silicon layer 226 can be made thicker, and the channel region layer 228 can be implanted in a top portion of the intrinsic silicon layer 226.

Figure 5:
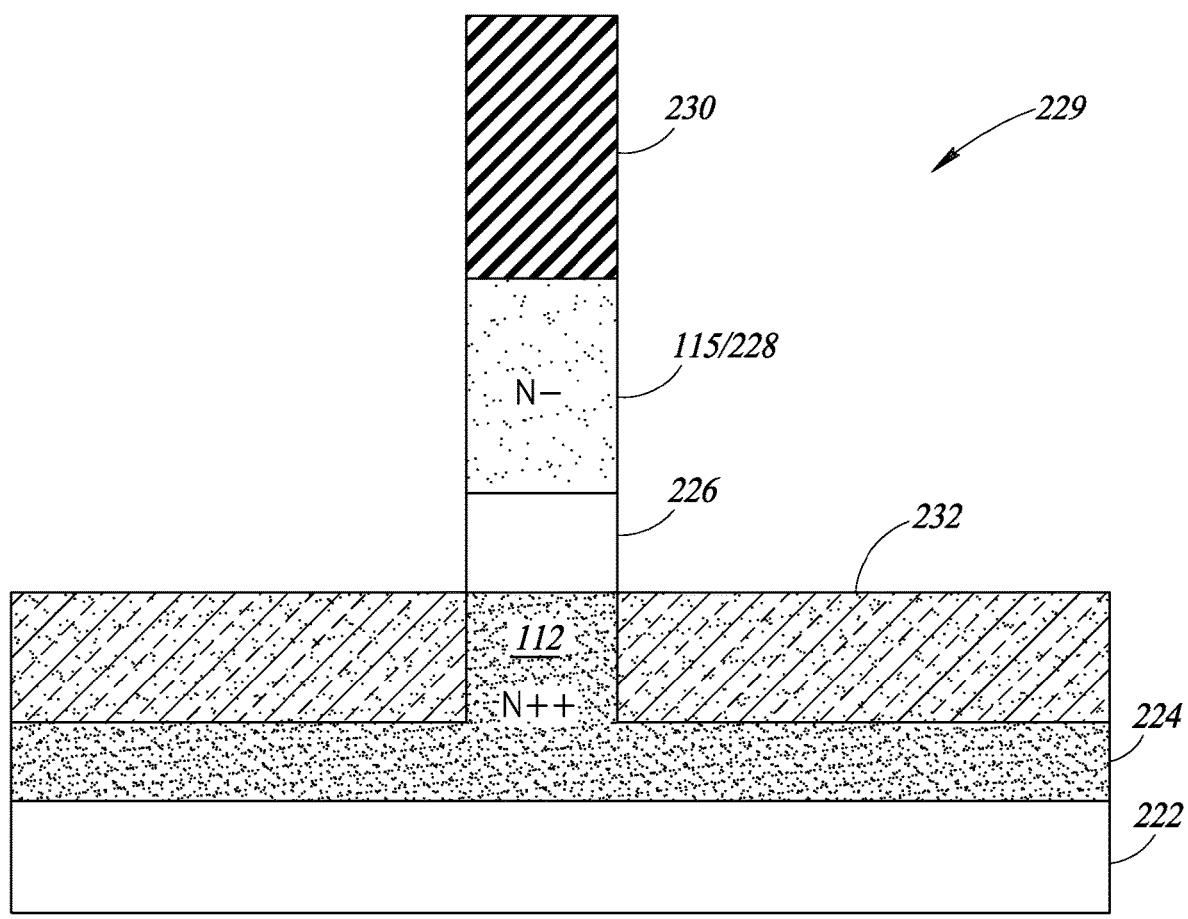

At 204, with reference to FIG. 5, a vertical structure 229 is patterned in the film stack 220, according to one embodiment. The vertical structure 229 can be directly patterned using, for example, a silicon nitride (SiN) hard mask 230, conventional extreme ultraviolet (EUV) lithography, and conventional etching techniques. In one embodiment, the SiN hard mask 230 can be patterned to define a 2-D vertical structure 229 configured as a fin. In one embodiment, the SiN hard mask 230 can be patterned to define a 1-D vertical structure 229 configured as a nanowire. Accordingly, the vertical structure 229 as shown in cross-section in the Figures represents both the fin and the nanowire configurations. The doped layers 224, 226, and 228 are then etched to form the $N^-$ channel 115 and the $N^{++}$ source 112. The hard mask 230 has a thickness in the range of about 30-50 nm. The etching process continues beyond the intrinsic silicon layer 226 so as to shape the $N^{++}$ source 112, but stopping before the boundary of the silicon substrate 222 is reached. The remaining partial $N^{++}$ source region layer 224 that extends across the silicon substrate 222 will later serve as a front side contact landing pad providing electrical access to the $N^{++}$ source 112. The resulting vertical structure 229 has a width, or critical dimension, in the range of about 6-15 nm.

Alternatively, the narrow vertical structure 229 may be patterned using a self-aligned sidewall image transfer (SIT) technique. The SIT process is capable of defining very high aspect ratio vertical structures 229 using sacrificial SiN sidewall spacers as the hard mask 230. According to the SIT technique, a mandrel, or temporary structure, is formed first, on top of the channel region layer 228. Then a silicon nitride film is deposited conformally over the mandrel and planarized, forming sidewall spacers on the sides of the mandrel. Then the mandrel is removed, leaving behind a pair of narrow sidewall spacers that serve as the hard mask 230. Using such a technique, very narrow mask features can be patterned in a self-aligned manner, without lithography. The SIT technique is also well known in the art and therefore is not explained herein in detail. The vertical structure 229 thus formed will serve as a lightly-doped channel region of the SFG FinFET devices.

After the vertical structure 229 is formed, a thick layer of silicon dioxide ($SiO_2$) 232 is deposited and initially is planarized, using a chemical-mechanical planarization (CMP) process, to stop on the hard mask 230. The rest of the vertical structure 229 is then revealed by recessing the oxide layer 232 down to the top of the $N^{++}$ source region layer 224 using, for example, a proprietary chemical oxide removal (COR) process available from Tokyo Electron America of Austin, Tex. Alternatively, the oxide recess can be performed using a proprietary silicon-cobalt-nickel oxide etching process available from Applied Materials Corporation of Santa Clara, Calif. After the oxide recess process is complete, the oxide layer 232 has a thickness within the range of about 10-20 nm.

Figure 6:
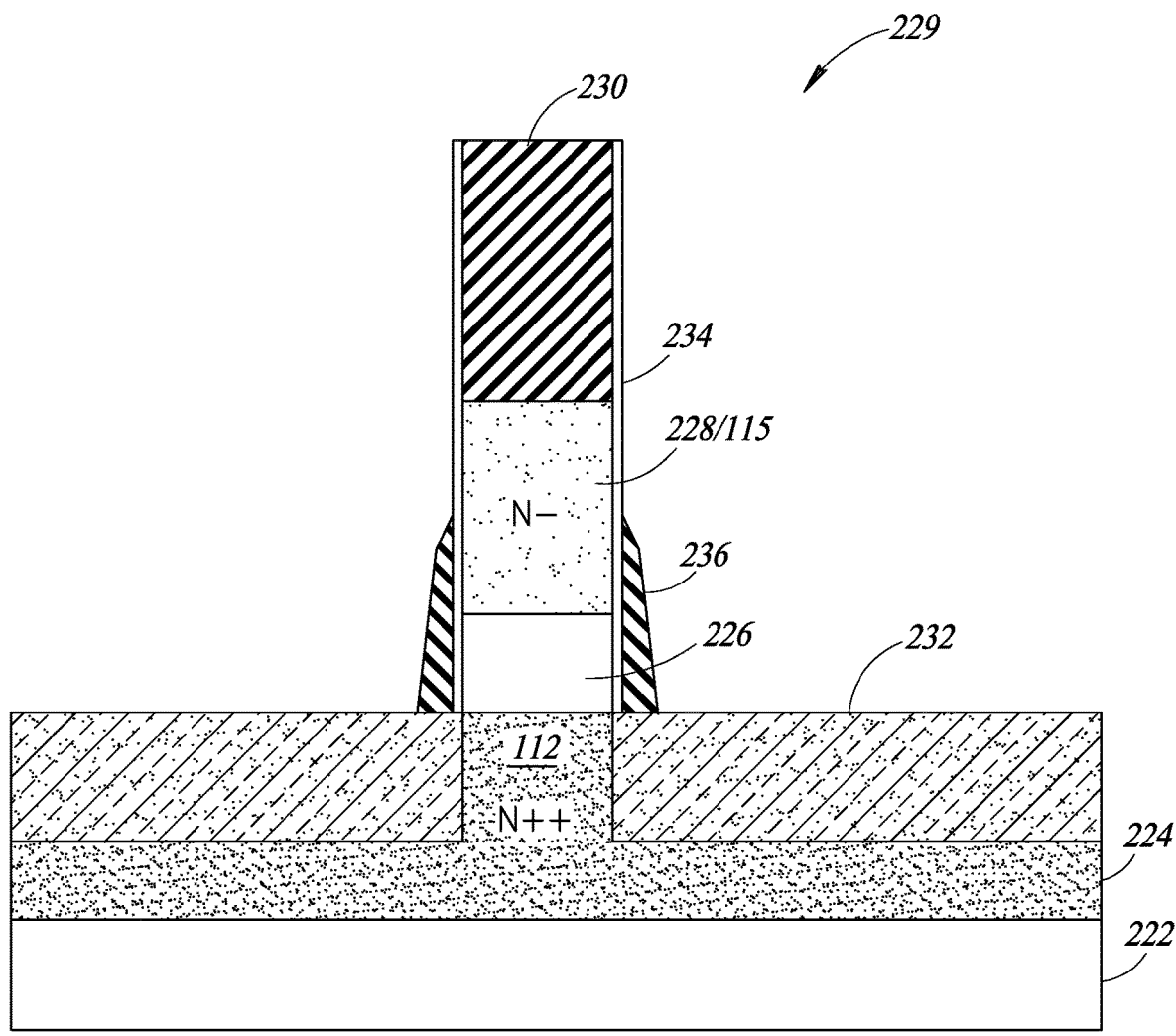

At 206, with reference to FIG. 6, a gate dielectric film 234 is formed on the sidewalls of the vertical structure 229, according to one embodiment. A thin, 2-5 nm dielectric layer is deposited conformally to cover the vertical structure 229, the oxide layer 232, and the hard mask 230, followed by deposition of a conformal SiN hard mask layer (not shown). The gate dielectric layer 234 can be made of, for example, $SiO_2$. Next, horizontal portions of the SiN hard mask are removed using a reactive ion etching process that has high selectivity to both silicon and oxide. The etching process is then continued to "pull down" the SiN, leaving behind the sidewall spacer 236, as shown in FIG. 6, which extends about half way up both sides of the lightly doped channel region layer 228. Because the gate dielectric layer 234 is so thin, horizontal portions of the gate dielectric layer 234 are also removed during the SiN pull-down process, leaving behind a portion of the vertical gate dielectric layer 234 that serves as the first gate dielectric 119. The sidewall spacer 236 will act as a mask during subsequent step 208.

Figure 7:
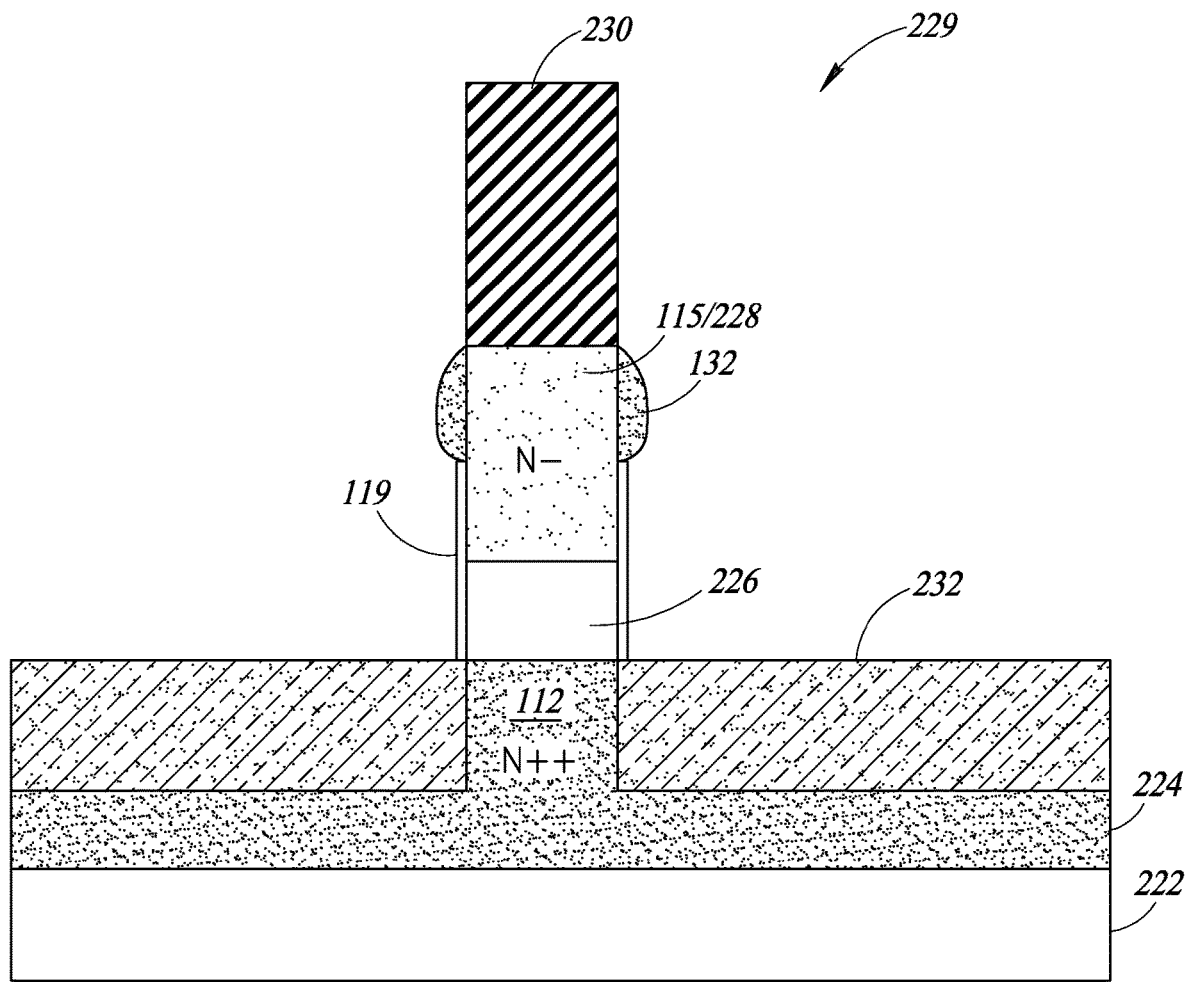

At 208, with reference to FIG. 7, a TFET and a p-n diode are formed, according to one embodiment. First, in preparation for epitaxial growth, an optional cleaning step can be performed using hydrochloric acid (HCl). This is known in the art as an 'SC1 epi pre-clean.' Then, $P^{++}$-doped SiGe regions that form the TFET source terminal 132 are epitaxially grown from exposed sidewalls of the $N^-$ channel 115 that are not covered by the sidewall spacer 236. $P^{++}$ dopants, e.g., a high concentration of boron atoms, are incorporated in-situ into the epitaxial SiGe, to form p-n junctions with the $N^-$ channel 115, at the sidewall of the vertical structure 229. After formation of the $P^{++}$-doped SiGe regions, the remaining sidewall spacer 236 can be removed by exposure to phosphoric acid.

Figure 8:
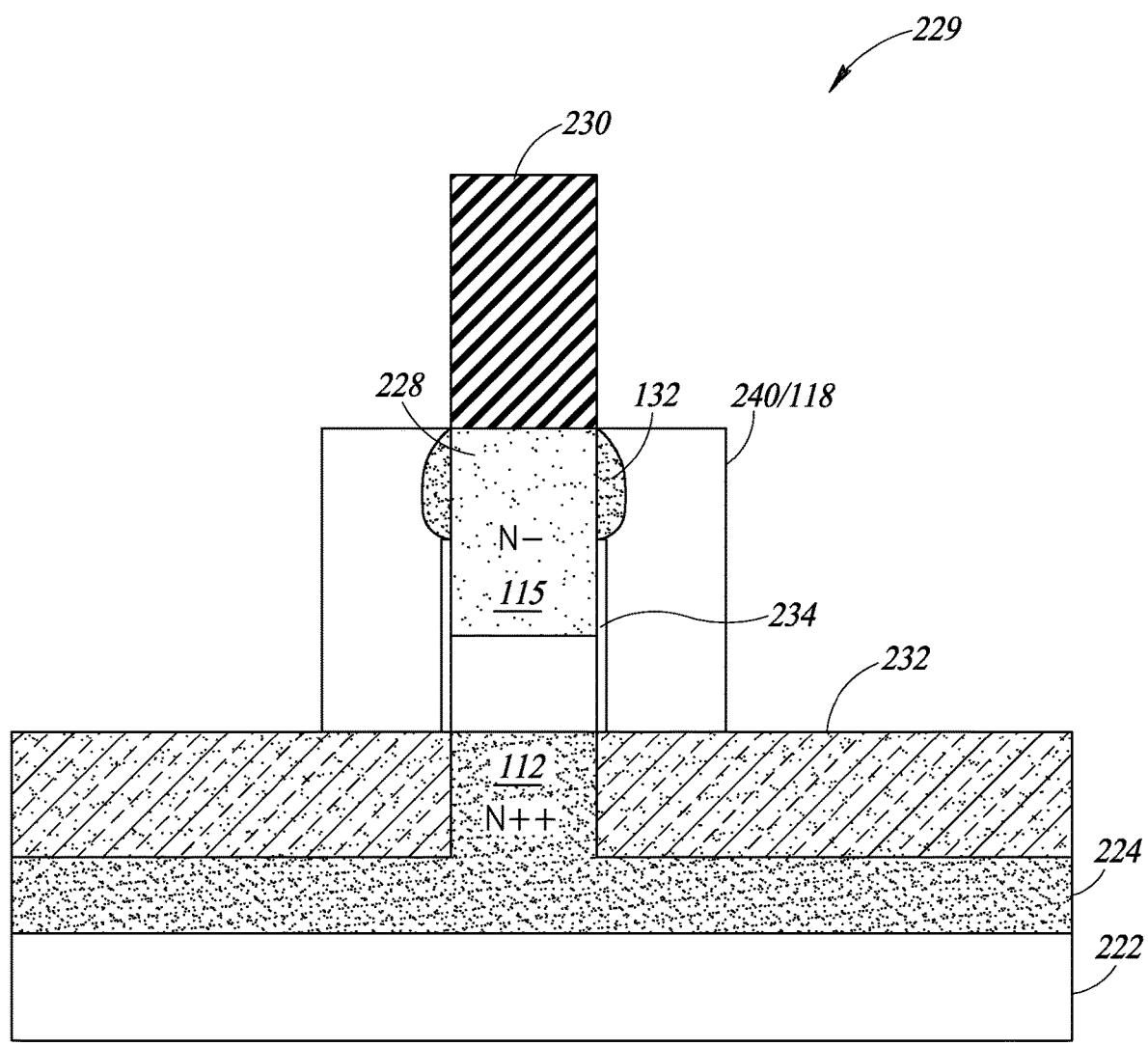

At 210, with reference to FIG. 8, the semi-floating gate 118 is formed, according to one embodiment. First, a polysilicon layer 240 is deposited on the oxide layer 232, and planarized to stop on the hard mask 230. The polysilicon layer 240 is then patterned to define the semi-floating gate 118, which abuts the first gate dielectric 119 on either side of the vertical structure 229.

Figure 9:
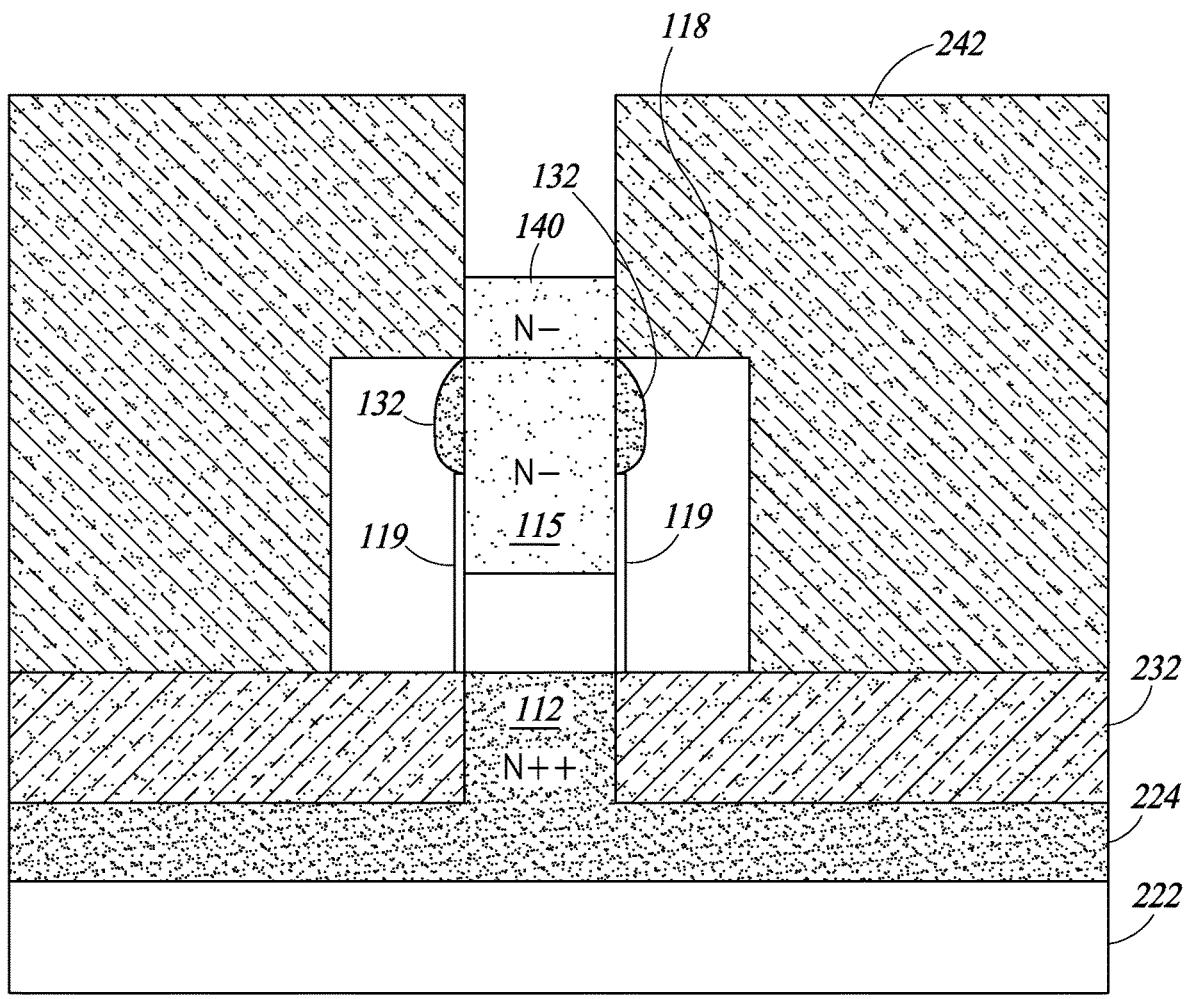
Figure 10:
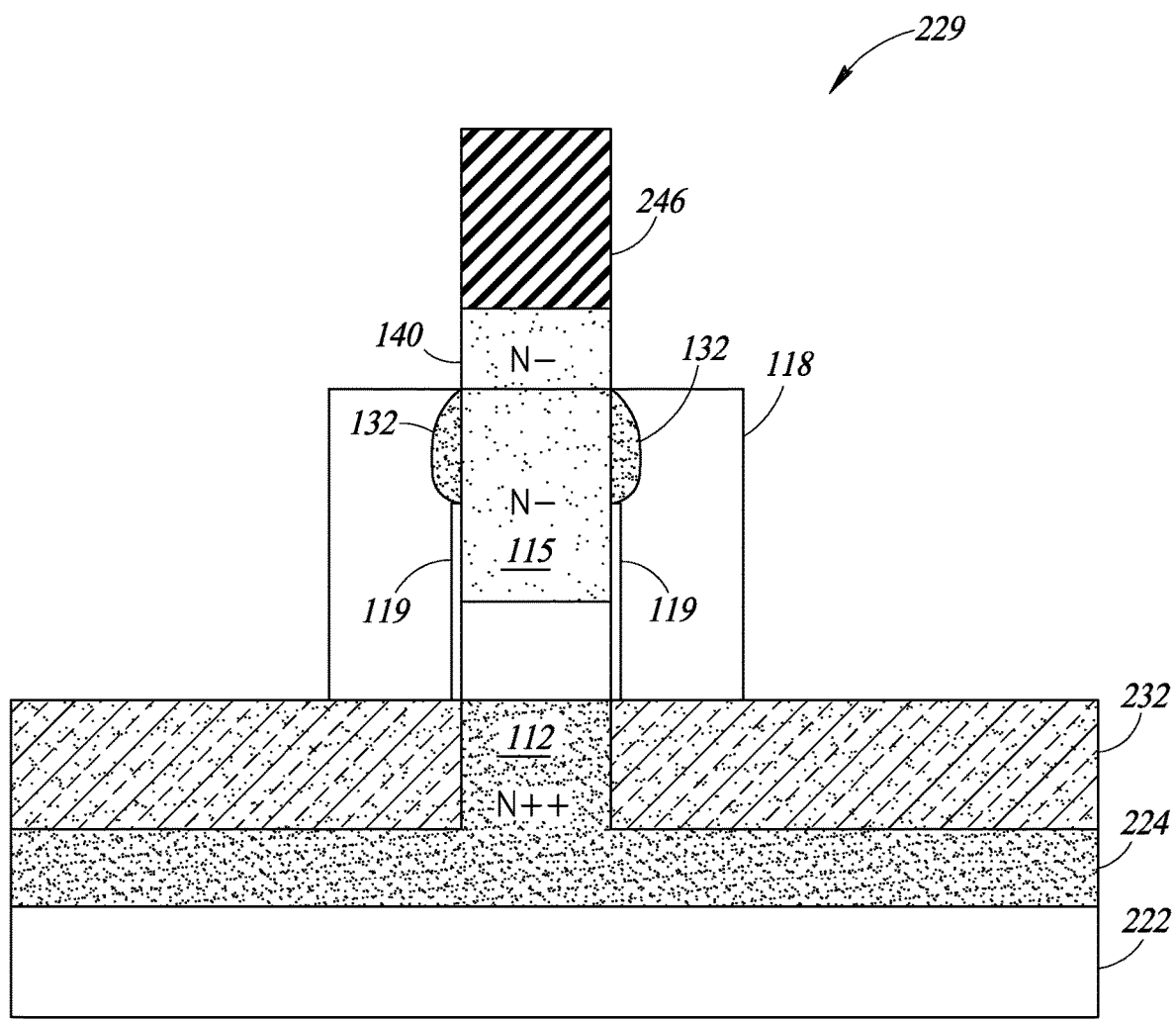

At 212, with reference to FIGS. 9 and 10, the TFET channel 140 is formed, according to one embodiment. First, a thick oxide layer 242 is deposited and planarized to stop on the hard mask 230 as shown in FIG. 9. Then, the hard mask 230 is removed, creating a trench, at the bottom of which an upper surface of the $N^-$ channel 115 is exposed. A trench epitaxial growth process then produces a lightly doped $N^-$ silicon film that serves as the TFET channel 140. A concentration of arsenic or phosphorous dopants that are incorporated, in-situ, into the epitaxial silicon, is in the range of about 2.0-3.0 E19 $cm^{-3}$, which is slightly more than the concentration of dopants in the $N^-$ channel 115.

Figure 11:
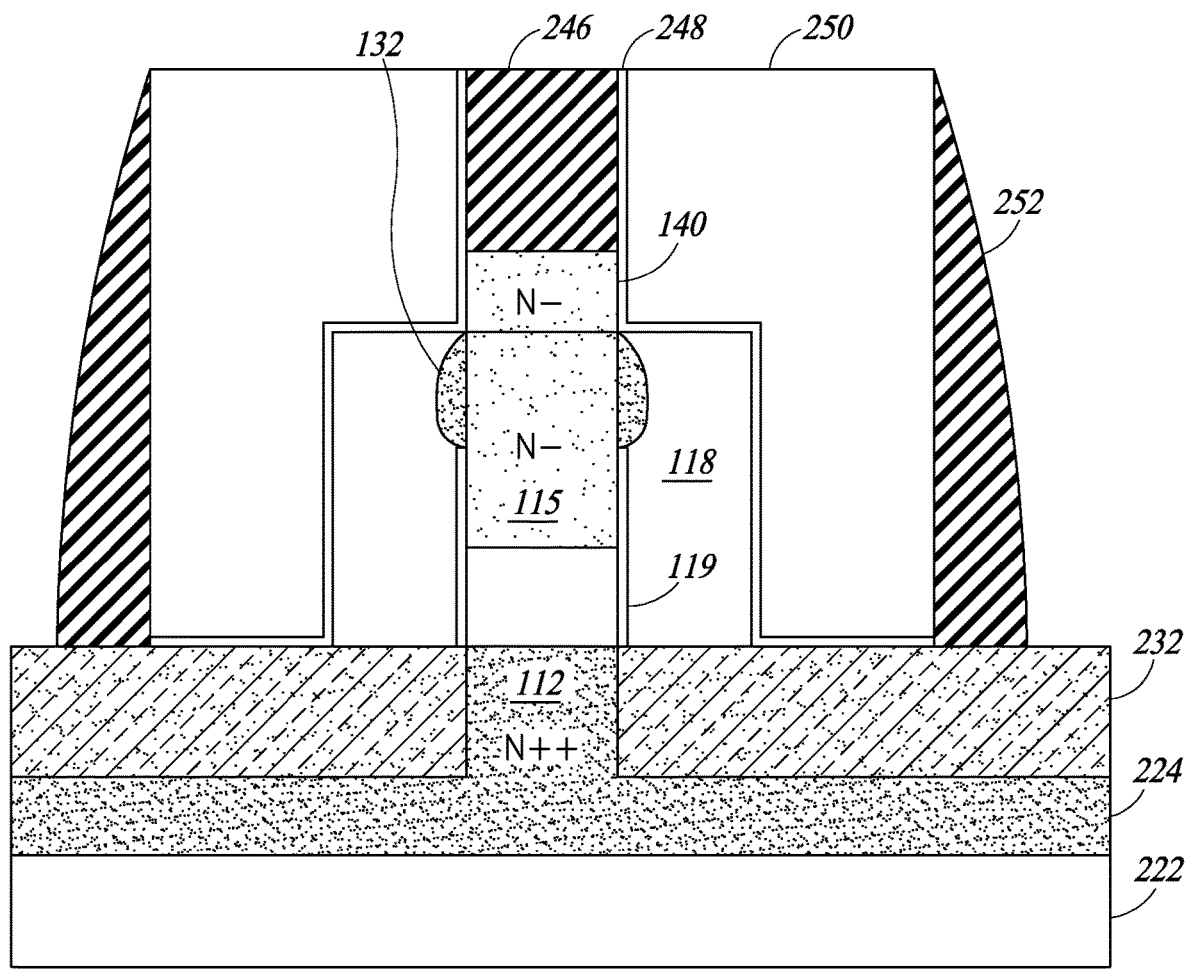

At 214, with reference to FIGS. 9-11, the control gate 116 is formed, according to one embodiment. First, the remaining volume of the trench, occupied by the TFET channel 140, is filled with a SiN plug 246. Then, the thick oxide layer 242 is removed, as shown in FIG. 10. Next, a thin high-k gate dielectric layer 248 is conformally deposited over exposed surfaces of the oxide layer 232, the semi-floating gate 118, sidewalls of the TFET channel 140, and the SiN plug 246, in a stair-step pattern, as shown in FIG. 11. In one embodiment, the high-k gate dielectric layer 248 is a 2-5 nm thick film of a high-k material such as, for example, hafnium oxide ($HfO_2$). Next, a dummy polysilicon layer 250 is formed in contact with the high-k gate dielectric layer 248. The dummy polysilicon layer 250 serves as a form for sidewall spacers. The high-k gate dielectric layer 248 and the dummy polysilicon layer 250 are then patterned together so that they extend along the surface of the oxide layer 232 to a distance of about 30 nm out from the center of the vertical structure 229. Next, SiN sidewall spacers 252 are formed on the sides of the dummy polysilicon layer 250. The sidewall spacers 252 can be formed in the usual way that entails blanket-depositing SiN over the gate structure, followed by a highly anisotropic SiN etch process that consumes all of the SiN on horizontal surfaces, while leaving behind most of the SiN on the vertical surfaces, thus forming the characteristic curved spacers shown in FIG. 11. The as-deposited SiN thickness is desirably in the range of about 6-12 nm.

Figure 12:
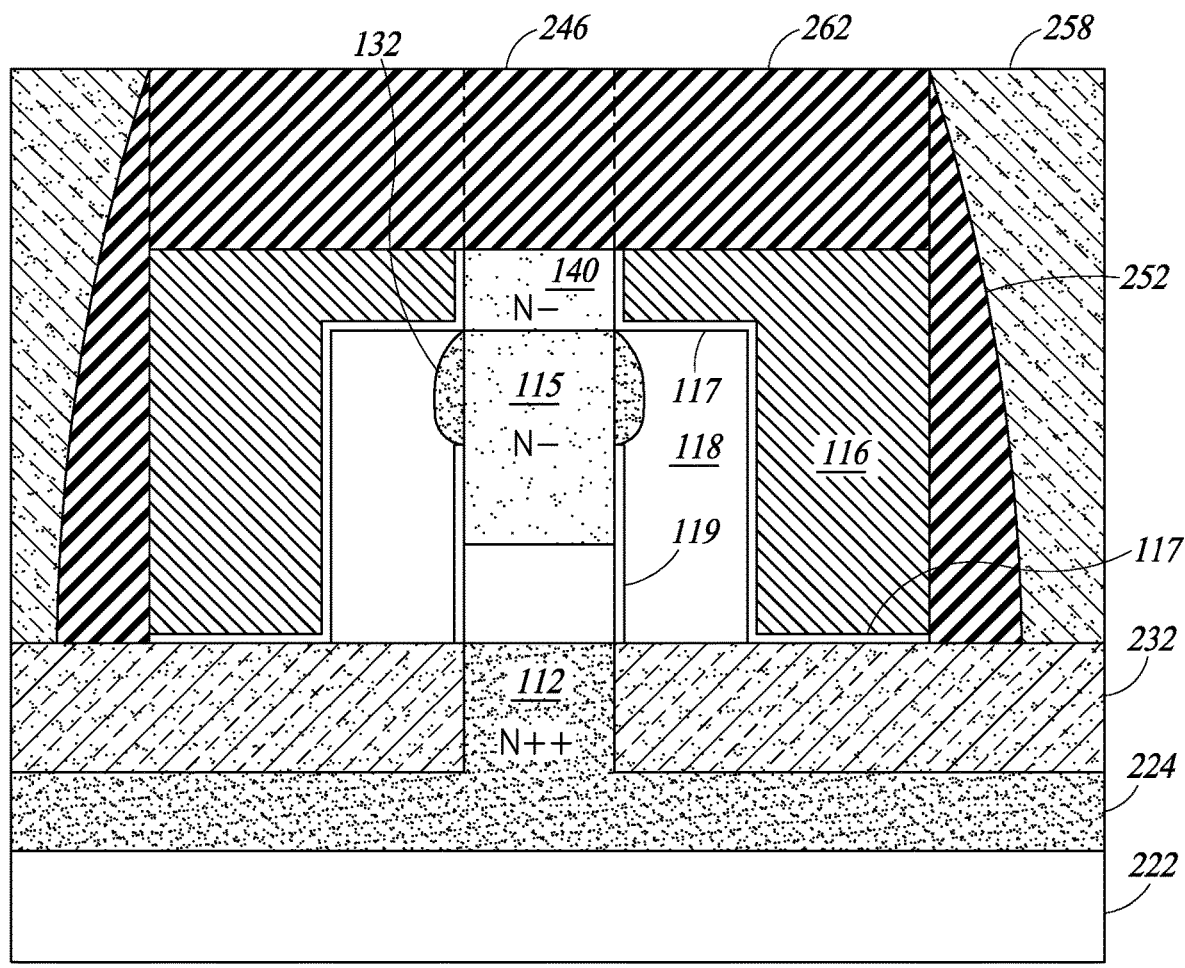
Figure 13:
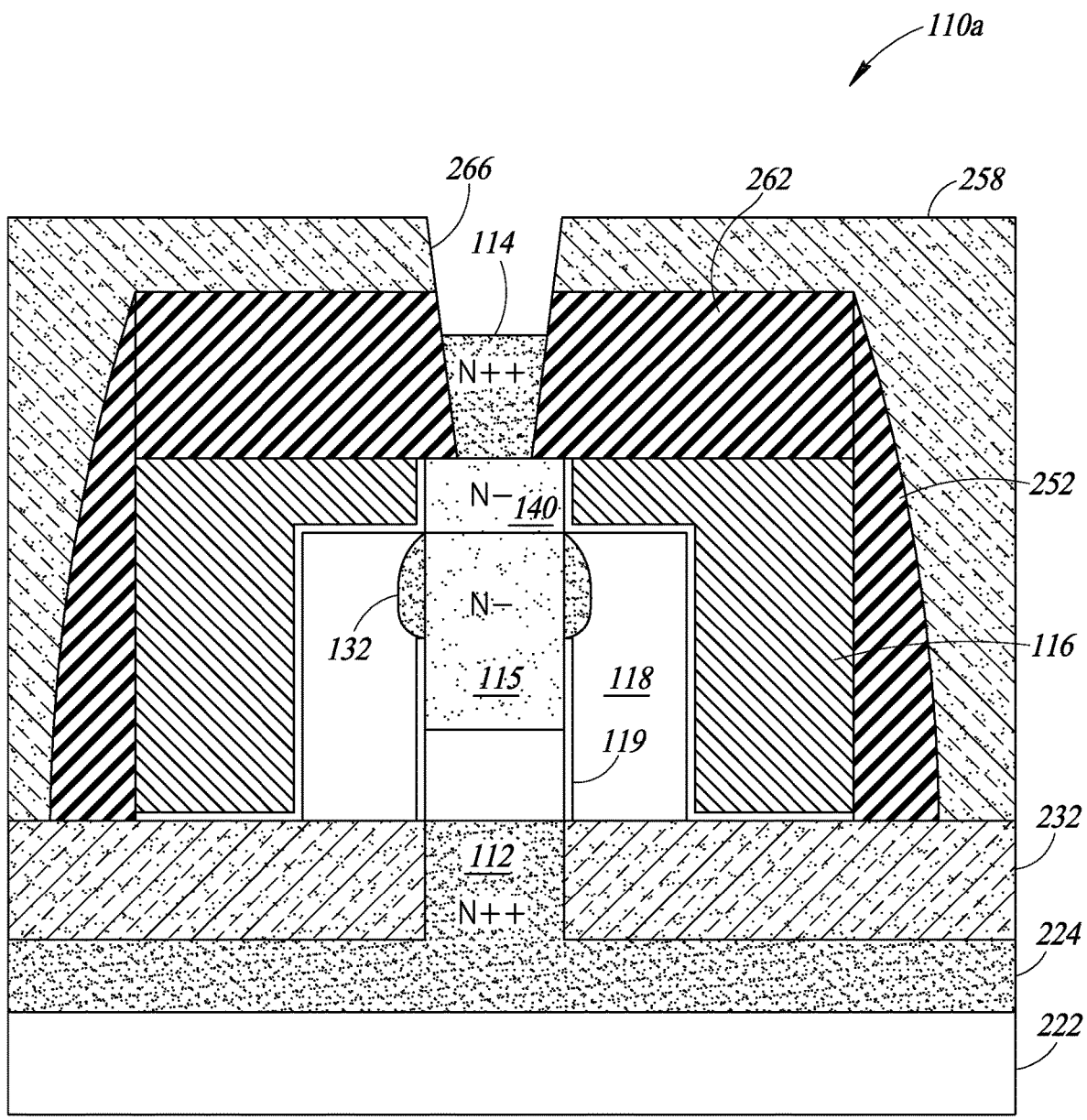

At 216, with reference to FIGS. 11-13, the dummy polysilicon layer 250 is replaced with a metal control gate 116 and the $N^{++}$ drain 114 is formed on top of the fin 229, according to one embodiment. First, the existing structure is covered with a dielectric layer 258, e.g., $SiO_2$, and planarized to stop on the SiN plug 246, as shown in FIG. 12. Next, with the sidewall spacers 252 in place and being supported by the dielectric layer 258, the entire dummy polysilicon layer 250 can be stripped away, for example, in an ammonium hydroxide ($NH_4OH$) bath, and replaced with metal to form the control gate 116. The control gate 116 is a work function metal, for example, a bi-metallic layer in which a first layer is made of titanium nitride (TiN) and/or titanium carbide (TiC) and a second layer is made of tungsten (W). The work function metal is initially deposited and planarized to the top of the sidewall spacer. Then the work function metal and the high-k gate dielectric layer 248 are recessed to match the height of the TFET channel 140, thus completing formation of the second gate dielectric 117 and the control gate 116. Then, the space between the tops of the sidewall spacers 252 is filled with an additional layer of SiN 262 up to the top surface of the SiN plug 246, as shown in FIG. 12. Next, the dielectric layer 258 is extended, e.g., $SiO_2$, is deposited on top of the existing structure, and then patterned to form a V-shaped trench 266 that extends downward through the dielectric layer 258 and the SiN plug 246, to the TFET channel 140. The $N^{++}$ drain 114 is then epitaxially grown to partially fill the V-shaped trench 266. During the epitaxial growth, the $N^{++}$ drain 114 is doped in-situ with negative dopants, e.g., phosphorous or arsenic, to a concentration of about 2.0-3.0 E 20. The remaining empty volume of the V-shaped trench 266 can later accept a metal drain contact. Meanwhile, contacts to the lateral extension of the $N^{++}$ source region layer 224 and the control gate 116 can be made in a similar fashion by forming trenches through the dielectric layer 258 and the SiN 262, according to known methods. The completed vertical semi-floating gate FET 110a is shown in FIG. 13.

Figure 14:
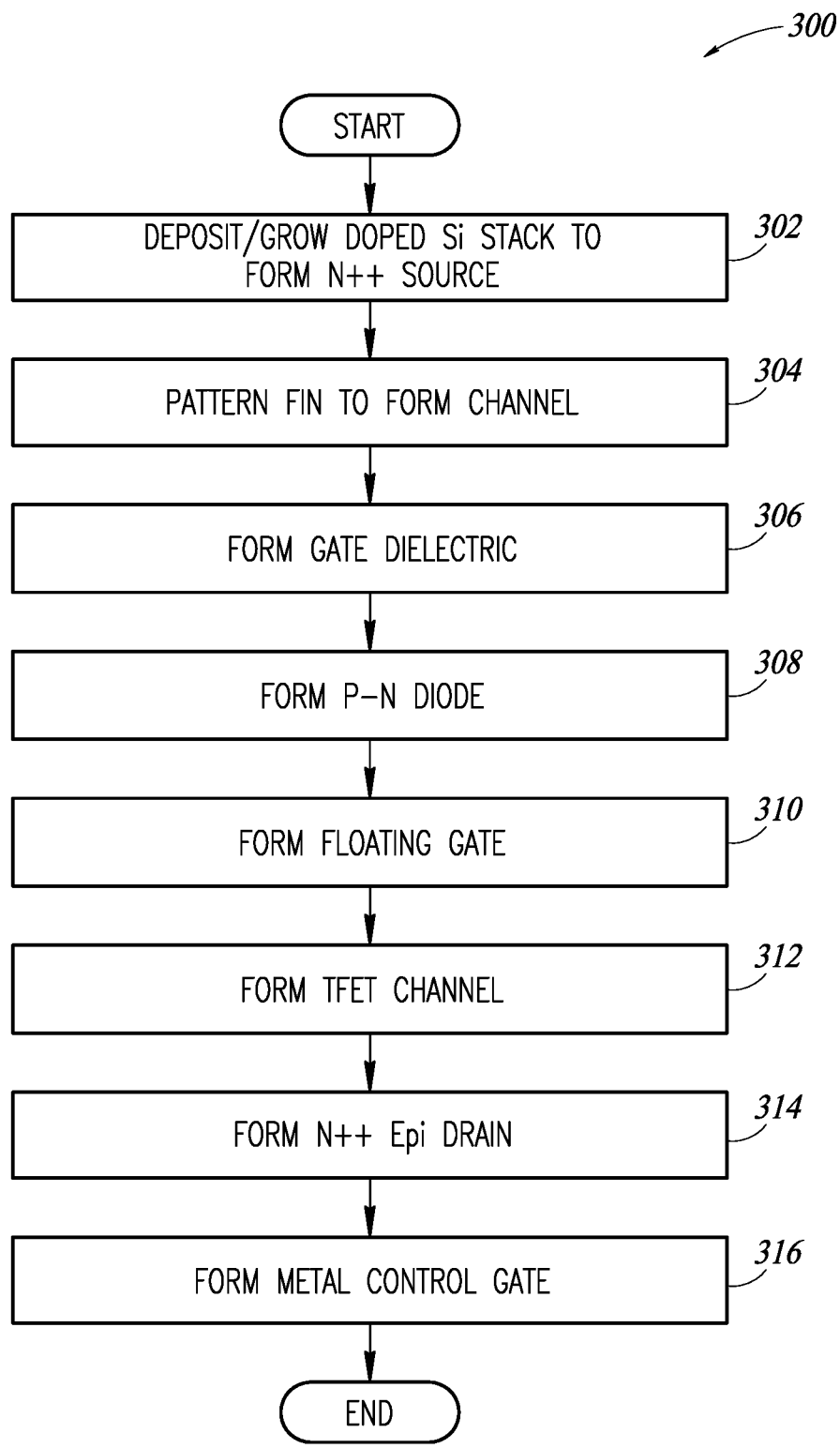
FIG. 14 is a flow diagram showing steps in an alternative method of fabricating a vertical SFG FET as illustrated in FIGS. 15-18, according to one embodiment described herein.

FIG. 14 shows an inventive alternative method 300 of fabricating a vertical semi-floating gate FET 110b according to one embodiment in which the $N^{++}$ drain 114 is self-aligned. The completed vertical SFG FET 110b produced by the method 300 is shown in FIG. 18. The steps 302-312 correspond to steps 202-212 in the method 200. However, the steps 314-316 are in the reverse order of steps 214-216, wherein the N$^{++}$ drain 114 is formed first, followed by formation of the control gate 116.

Figure 15:
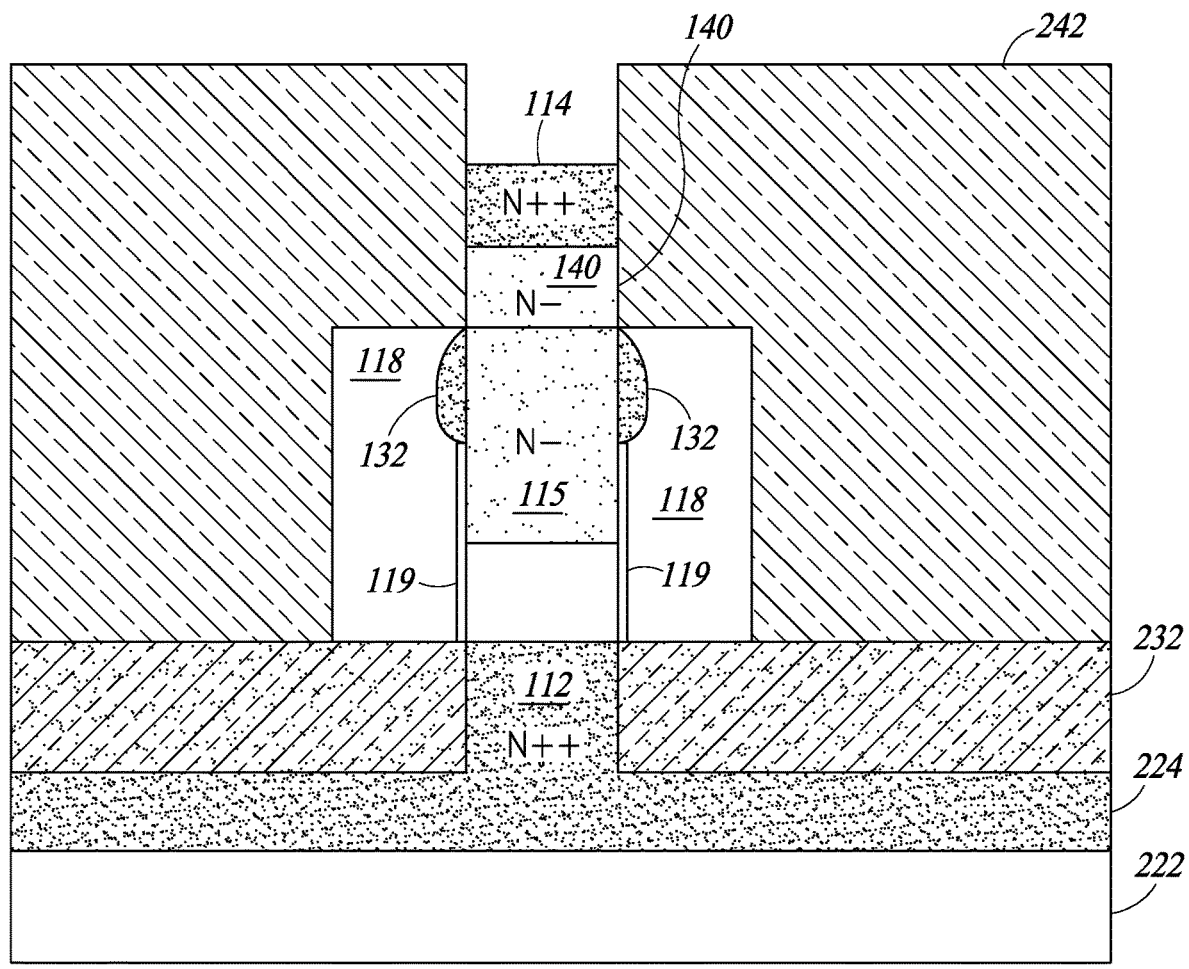
FIGS. 15-18 are cross-sectional views of a vertical SFG FET at successive steps during fabrication, using the method outlined in FIG. 14.

At 314, with reference to FIG. 15, the N$^{++}$ drain 114 is grown epitaxially directly following the epitaxial growth that forms the TFET channel 140, for example, by simply extending the time interval of the epitaxial growth process while increasing the in-situ dopant concentration.

Figure 16:
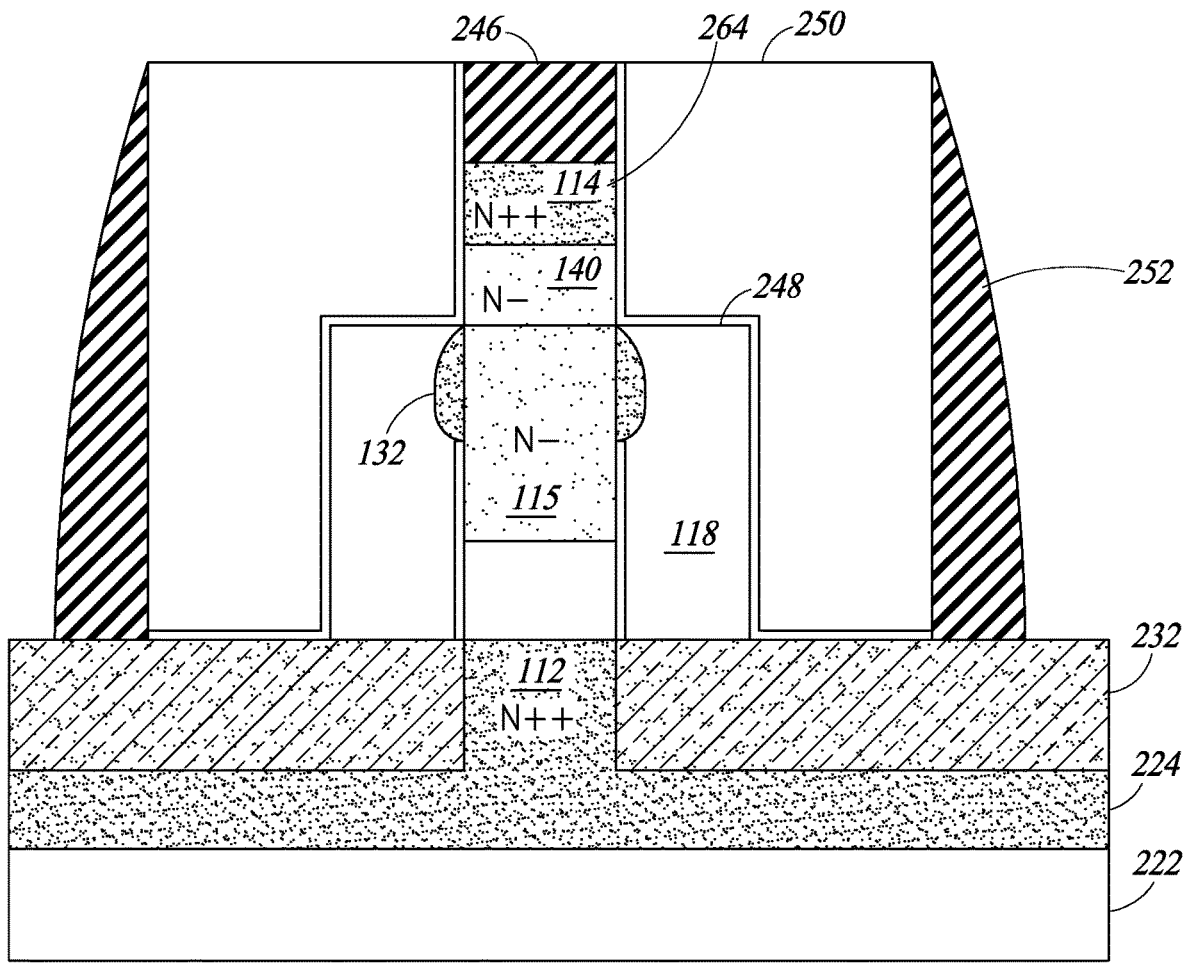
Figure 17:
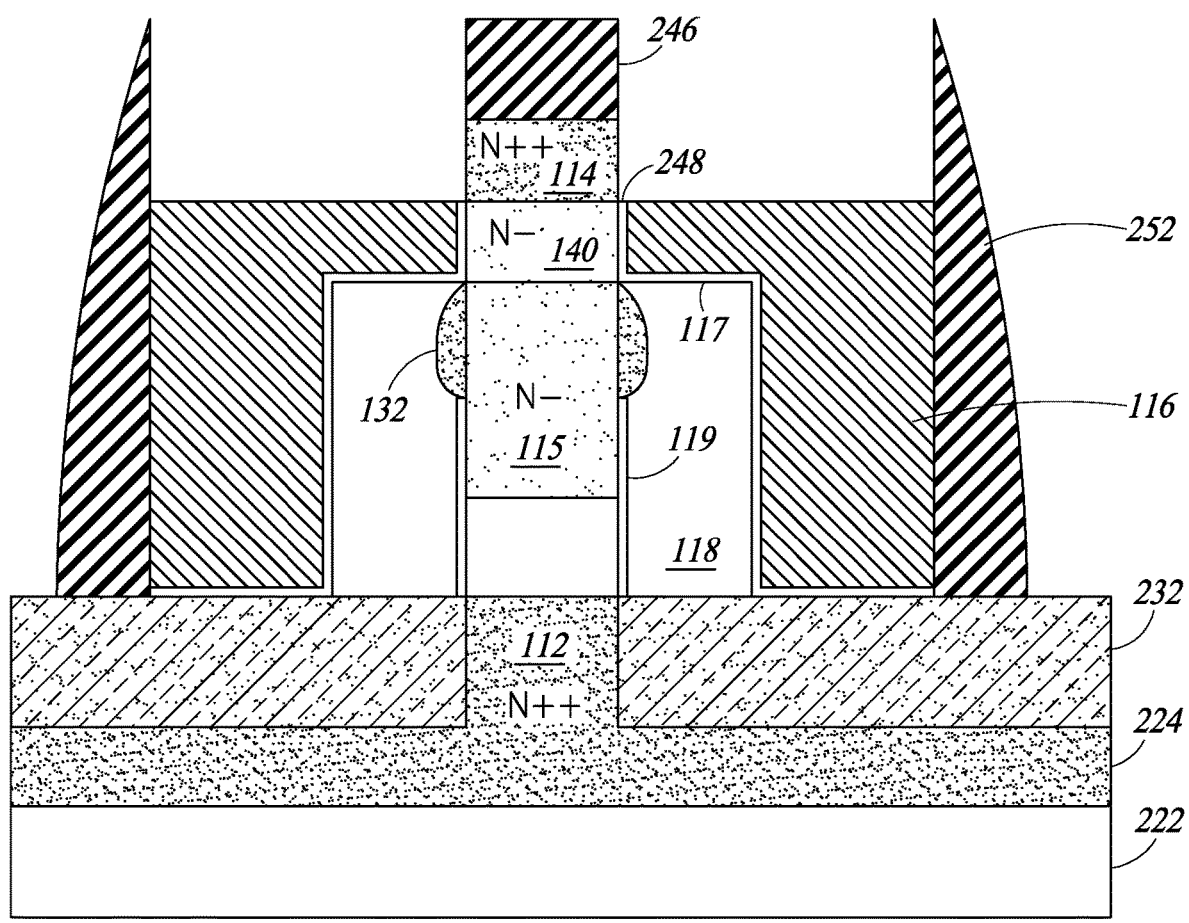

At 316, with reference to FIGS. 15-18, the dummy polysilicon layer 250 is formed as a mold for the sidewall spacers 252, and then the dummy polysilicon layer 250 is removed and replaced with metal to form the metal control gate 116. First, the space above the N$^{++}$ drain 114 is filled with the SiN plug 246 and planarized down to the top surface of the thick oxide layer 242, before removing the thick oxide layer 242. With reference to FIG. 16, the high-k gate dielectric layer 248 and the dummy polysilicon layer 250 are then deposited and patterned as described above, followed by formation of the SiN sidewall spacers 252 in the usual way, as is known in the art. With reference to FIG. 17, the dummy polysilicon layer 250 is then partially recessed, to a level below the N$^{++}$ drain 114, to allow recessing the high-k gate dielectric layer 248 from the sides of the N$^{++}$ drain 114, e.g., using a hydrofluoric acid-based wet etch. The remaining dummy polysilicon layer 250 is then stripped and replaced with the work function metal and tungsten, as described above, and planarized to the level of the SiN plug 246. The work function metal is then recessed down to the level of the bottom surface of the N$^{++}$ drain 114. The remaining space above the metal control gate 116 is then filled with SiN, and the structure is covered with the dielectric layer 258 to produce the final structure shown in FIG. 18. As described above, contacts can be etched through the various oxide and SiN layers to access the source, control gate, and drain terminals from the front side of the wafer, by methods well known in the art.

By comparing the schematics shown in FIGS. 2a and 2b with the completed devices 110a, 110b shown in FIGS. 13 and 18, respectively, a correspondence can be drawn between the terminals of the schematic and the various regions of the integrated vertical SFG FET. Embodiments 110a, 110b of the integrated vertical SFG FET include the highly doped N$^{++}$ source 112 on the bottom, the lightly-doped N$^-$ channel 115 within the vertical structure 229, and the N$^{++}$ drain 114 that is heavily doped to have a same polarity as that of the N$^-$ channel 115 and the N$^{++}$ source 112. The N$^-$ channel 115 extends between the source and drain regions 112, 114. In the fin configuration, the semi-floating gate 118 abuts the fin from two sides. Likewise, the control gate 116 abuts the semi-floating gate 118 so as to attract or repel charge on the semi-floating gate 118 in response to an applied voltage. The metal control gate 116 is L-shaped so as to form an embedded TFET at the drain end of the device. In the nanowire configuration, the semi-floating gate 118 and the control gate 116 wrap around the nanowire in a concentric arrangement. The P$^{++}$-doped SiGe region that serves as the TFET source terminal 132 is positioned between the N$^-$ channel 115 and the semi-floating gate 118, at the drain end of the N$^-$ channel 115, thus forming a p-n junction diode between the P$^{++}$-doped SiGe and the N$^{++}$ drain 114.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A device, comprising:
    a substrate;
    a source in the substrate, the source having a first type of conductivity;
    a channel on the source, the channel having the first type of conductivity, the channel having sidewalls extending away from the substrate;
    a drain on the channel, the drain having the first type of conductivity;
    a terminal on first portions of the sidewalls of the channel, the terminal having a second type of conductivity;
    a first gate on the terminal and adjacent to second portions of the sidewalls; and
    a second gate on the first gate, first portions of the second gate being spaced from the second portions of the sidewalls by the first gate.

2. The device of claim 1, further comprising a gate dielectric on the second portions of the sidewalls and positioned between the channel and the first gate.

3. The device of claim 2 wherein the terminal is in direct contact with the first portions of the sidewalls of the channel.

4. The device of claim 1, wherein the source has sidewalls substantially aligned with the sidewalls of the channel in a first direction.

5. The device of claim 4, wherein the drain has sidewalls substantially aligned with the sidewalls of the channel in the first direction.

6. The device of claim 5, further comprising a dielectric layer on the second gate and adjacent to the sidewalls of the drain.

7. The device of claim 6, wherein the first gate is spaced from the dielectric layer by second portions of the second gate.

8. A device, comprising:
    a vertically arranged transistor, including:
        a source having sidewalls along a first direction, the source having a first type of conductivity;
        a first channel on the source, the first channel having sidewalls that extend along the first direction and are substantially aligned with the sidewalls of the source, the first channel having the first type of conductivity;
        a second channel on the first channel, the second channel having sidewalls that extend along the first direction and are substantially aligned with the sidewalls of the first channel, the second channel having the first type of conductivity;

a drain on the second channel, the drain having sidewalls that extend along the first direction and are substantially aligned with the sidewalls of the second channel, the drain having the first type of conductivity;

a first gate on the sidewalls of the first channel;

a second gate on the first gate and on the sidewalls of the second channel; and a terminal on the sidewalls of the first channel, the terminal having a second type of conductivity.

9. The device of claim 8 wherein the second gate includes a first portion on the first gate and a second portion adjacent to sidewalls of the first gate.

10. The device of claim 9 wherein a first distance between sidewalls of the first gate in the first direction is greater than a second distance between sidewalls of the source in the first direction.

11. The device of claim 8, wherein the terminal is on first portions of the sidewalls of the first channel, and the first gate is on the terminal.

12. The device of claim 11, wherein a dielectric layer is on second portions of the sidewalls of the first channel, positioned between the first gate and the first channel.

13. The device of claim 8, further comprising a dielectric layer adjacent to the sidewalls of the source, the first gate and the second gate being on the dielectric layer.

14. A device, comprising:

a substrate having a first surface;

a source in the substrate, the source having a second surface that is coplanar with the first surface of the substrate, the source having a first type of conductivity;

an intrinsic silicon layer on the second surface of the source;

a first channel on the intrinsic silicon layer, the first channel having the first type of conductivity;

a second channel on the first channel, the second channel having the first type of conductivity;

a drain on the second channel, the drain having the first type of conductivity;

a terminal on a sidewall of the first channel, the terminal having a second type of conductivity;

a first gate on the terminal and adjacent to the first channel and the intrinsic silicon layer; and a second gate on the first gate.

15. The device of claim 14, wherein the second gate has first portions on the first gate and second portions on sidewalls of the first gate.

16. The device of claim 15 wherein a first surface of the second gate and a first surface of the second channel are coplanar.

17. The device of claim 1 wherein the channel has a dopant concentration that is lower than a dopant concentration of the source and lower than a dopant concentration of the drain.

* * * * *